(12) United States Patent
Kazaana

(10) Patent No.: US 7,829,263 B2
(45) Date of Patent: Nov. 9, 2010

(54) EXPOSURE METHOD AND APPARATUS, COATING APPARATUS FOR APPLYING RESIST TO PLURAL SUBSTRATES, AND DEVICE MANUFACTURING METHOD

(75) Inventor: Tetsuji Kazaana, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 848 days.

(21) Appl. No.: 11/567,311

(22) Filed: Dec. 6, 2006

(65) Prior Publication Data

US 2007/0128529 A1  Jun. 7, 2007

(30) Foreign Application Priority Data

Dec. 7, 2005  (JP)  ............................. 2005-354019
Oct. 5, 2006  (JP)  ............................. 2006-273904

(51) Int. Cl.
*G03F 7/00*    (2006.01)
*G06F 19/00*   (2006.01)
*G03B 27/32*   (2006.01)
(52) U.S. Cl. ........................ 430/311; 700/121; 355/27
(58) Field of Classification Search ............. 101/463.1; 118/666; 250/548; 399/49; 438/14; 430/22, 430/30, 11; 700/121; 355/27, 30, 53
See application file for complete search history.

(56) References Cited

U.S. PATENT DOCUMENTS 6,641,981 B1 * 11/2003 Kaneko et al. .............. 430/311
6,889,014 B2 *  5/2005 Takano ........................ 399/49
6,897,076 B2 *  5/2005 Sugiura ....................... 438/14

FOREIGN PATENT DOCUMENTS

JP  2001-144009  5/2001
JP  2004-119570  4/2004
JP  2006-128572  5/2006

* cited by examiner

*Primary Examiner*—Mark F Huff
*Assistant Examiner*—Stewart A Fraser
(74) *Attorney, Agent, or Firm*—Cowan, Liebowitz & Latman, P.C.

(57) ABSTRACT

Disclosed are an exposure method and apparatus, a coating apparatus and a device manufacturing method, wherein, in one preferred form, the exposure method is used to expose a resist having been applied onto a substrate by one of a plurality of resist coating units, and it includes a selecting step for choosing an exposure amount pattern that represents exposure amounts corresponding to a plurality of shots on the substrate, respectively, on the basis of a resist coating unit data that specifies which unit among the plurality of resist coating units should be used to apply a resist onto the substrate, and an exposure step for exposing the resist on the substrate in accordance with the exposure amount pattern chosen by the selecting step.

4 Claims, 8 Drawing Sheets

EXPOSURE METHOD AND APPARATUS, COATING APPARATUS FOR APPLYING RESIST TO PLURAL SUBSTRATES, AND DEVICE MANUFACTURING METHOD

FIELD OF THE INVENTION AND RELATED ART

This invention relates generally to an exposure method, an exposure apparatus, a coating apparatus for applying a resist onto plural substrates, and a device manufacturing method.

The lithographic process includes a process for coating a wafer (substrate) with a resist, a process for exposing the resist on the wafer with radiation to produce a latent image thereon, and a process for developing the latent image formed on the resist. In these processes, an apparatus called a coater developer arranged to perform resist coating and development, as well as an exposure apparatus are used. For example, by using a coater developer, a resist is applied onto a wafer and, after this, the wafer is transferred to an exposure apparatus by which a mask (original) is illuminated and an image of the patter of the mask is projected onto the resist, whereby a latent image is formed thereon. Subsequently, the wafer is moved back to the coater developer, by which the latent image formed on the resist is developed.

Generally, when a wafer is coated with a resist material, the thickness of the resist film will fluctuate to cause thickness dispersion. Such resist thickness dispersion adversely influences the linewidth of a pattern to be formed on the wafer. Thus, for better precision of pattern formation, the influence has to be reduced.

In this regard, Japanese Laid-Open Patent Application, Publication No. 2001-144009 concerns a method of setting the exposure amount in accordance with the resist film thickness. For obtaining resist-film-thickness dispersion data, this patent document discloses a method of actually measuring the resist film thickness for all wafers, or a method of previously memorizing the resist-film-thickness dispersion which is peculiar to the resist applying apparatus.

Japanese Laid-Open Patent Application, Publication No. 2004-119570 discloses a method in which the resist film thickness is measured inside an exposure apparatus and the exposure amount is corrected in accordance with a database that represents the relationship between the resist film thickness and the optimum exposure amount therefor, having been prepared beforehand.

On the other hand, for improvements of throughput (the number of wafers to be processed per unit time), shortening the processing time of the procedure from the resist coating to the resist development has been required.

However, with the method disclosed in Japanese Laid-Open Patent Application, Publication No. 2004-119570, the resist film thickness has to be measured with respect to every wafer and it needs additional time for the measurement prior to start of the exposure operation. This causes a delay of exposure process and a decrease of throughput. In this regard, preparing resist-film-thickness dispersion peculiar to the resist coating machine to be used and correcting the exposure amount based on it, as disclosed in Japanese Laid-Open Patent Application, Publication No. 2001-144009, will be effective.

Here, a resist coating apparatus having a plurality of resist coating units will be considered. In such example, these plural resist coating units are used in combination with a single exposure apparatus. Hence, there is a possibility that, if the resist coating unit used to apply a resist material onto a wafer is different, the resist film thickness is different for the wafers loaded into the exposure apparatus for exposure. This means that, even if dispersion data of resist film thickness related to a particular resist coating unit is prepared, it doesn't assure correct exposure amount and, thus, the exposure process would be delayed. In order to avoid this, there should be operational association between these resist coating units and the single exposure apparatus. However, Japanese Laid-Open Patent Application, Publication No. 2001-144009 mentions nothing about the operational association between these resist coating units and the single exposure apparatus.

SUMMARY OF THE INVENTION

It is accordingly an object of the present invention to provide an exposure method and apparatus by which, when wafers are to be processed successively, the exposure amount can be corrected without the exposure process delay.

In accordance with an aspect of the present invention, there is provided an exposure method for exposing a resist having been applied onto a substrate by one of a plurality of resist coating units, said method comprising: a selecting step for choosing an exposure amount pattern that represents exposure amounts corresponding to a plurality of shots on the substrate, respectively, on the basis of a resist coating unit data that specifies which unit among the plurality of resist coating units should be used to apply a resist onto the substrate; and an exposure step for exposing the resist on the substrate in accordance with the exposure amount pattern chosen by said selecting step.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
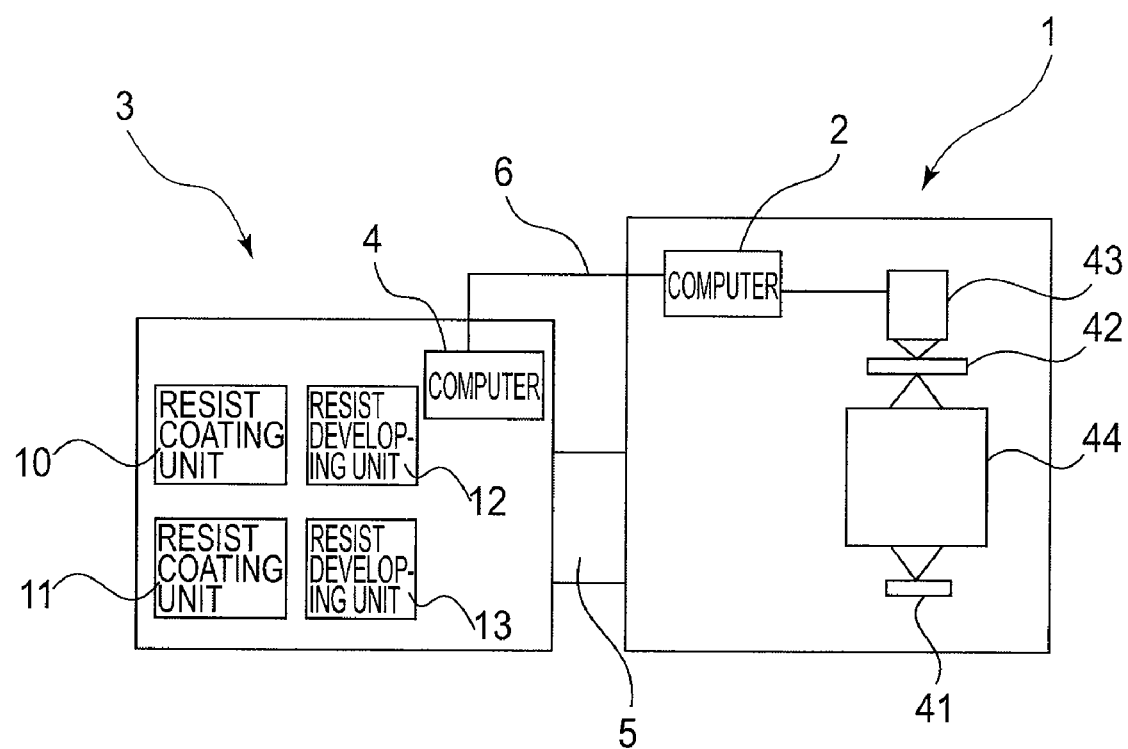
FIG. 1 is a schematic view of a general structure of an exposure apparatus and a coater developer in a first embodiment of the present invention.

Referring first to FIG. 1, a general structure of the first embodiment will be explained. In FIG. 1, an exposure apparatus 1 and a coater developer 3 are connected to each other through a wafer conveying portion 5. The exposure apparatus 1 is arranged so that a mask 42 which is an original is illuminated by an illumination optical system 43 with light from a light source, and an image of a pattern of the mask 42 is projected onto a resist material applied to a wafer 41 which is a substrate, for exposure of the same. A latent image is produced thereby on the resist. A coater developer 3 which is a resist coating and developing machine includes a resist coating unit for applying a resist onto a wafer, and a resist developing unit for developing the latent image formed on the resist. Here, the word "unit" refers to a mechanism unit for providing a desired function.

In this embodiment, the coater developer 3 houses therein a plurality of resist coating units 10 and 11, and a plurality of resist developing units 12 and 13. Each unit is arranged to process plural substrates successively. In the coating process by the resist coating units, since the processing time is longer as compared with the exposure process in the exposure apparatus, plural resist coating units are used in relation to a single exposure apparatus. By this, the throughput can be improved without a delay of exposure process. Furthermore, even if any unit of the plurality of resist coating units is stopped due to malfunction, the operation from the resist coating to resist development can be continued by using the other units.

Figure 2:
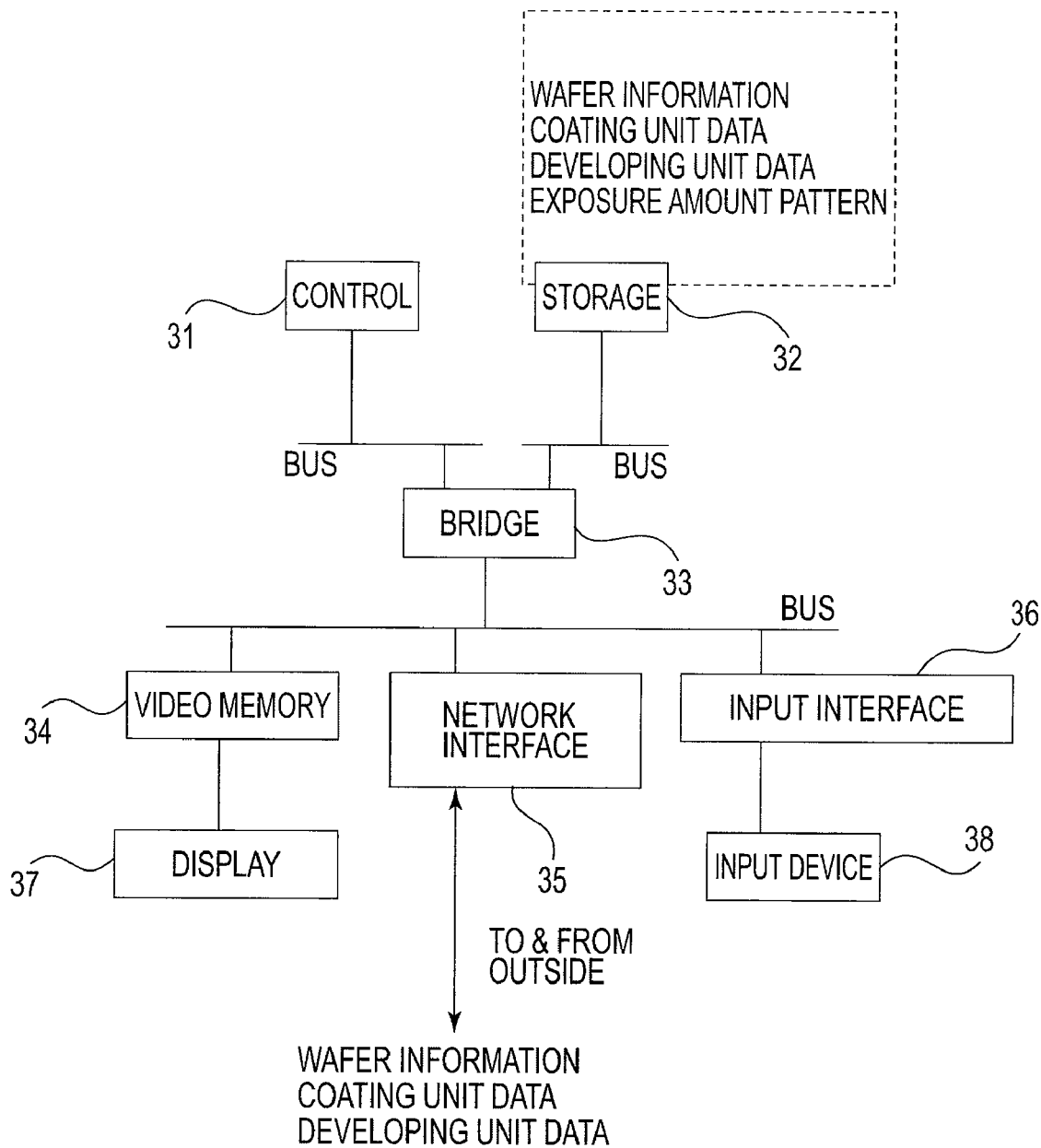
FIG. 2 is a diagrammatic view for explaining the structure of a computer.

The exposure apparatus 1 has a computer 2 provided therein, while the coater developer 3 has a computer 4 provided therein. FIG. 2 illustrates the structure usable for the computers 2 and 4. As shown in FIG. 2, the computer comprises a control 31, a memory (storage) 32, a bridge 33, a video memory 34, a network interface 35, and an input interface 36. Theses components are connected to the bridge 33 through a bus. Furthermore, the video memory 34 is connected to a display 37, while the input interface 36 is connected to an input device 38.

The network interface 35 is connected to an outside machine or to various devices inside the exposure apparatus, such as an illumination optical system 23, a projection optical system 24, a reticle stage and a wafer stage, not shown. As a specific example, a CPU or a DSP may be used as the control 31, and a memory such as RAM may be used as the storage 32. A mouse or keyboard may be used as the input device 38. Any information obtained by an outside device through the network interface 35 is stored into the memory through the bridge 33. On the basis of the thus stored information, the control 31 performs program execution and data calculation, and the result of calculation is appropriately displayed at the display 37 through the video memory 34. This is also with the case of the information obtained through the input device 38.

The network interface 35 of the computer 2 is connected to the network interface 35 of the computer 4 through a communication line 6, and wafer information, coating unit information and developing unit information are transmitted between them. As regards the communication line 6, a data transfer cable such as a serial cable (e.g., RS-232C) or a parallel cable may be used. In the computer 2, these information and data are stored into the memory through the bridge, and program execution and data calculation are carried out in the control.

Figure 3:
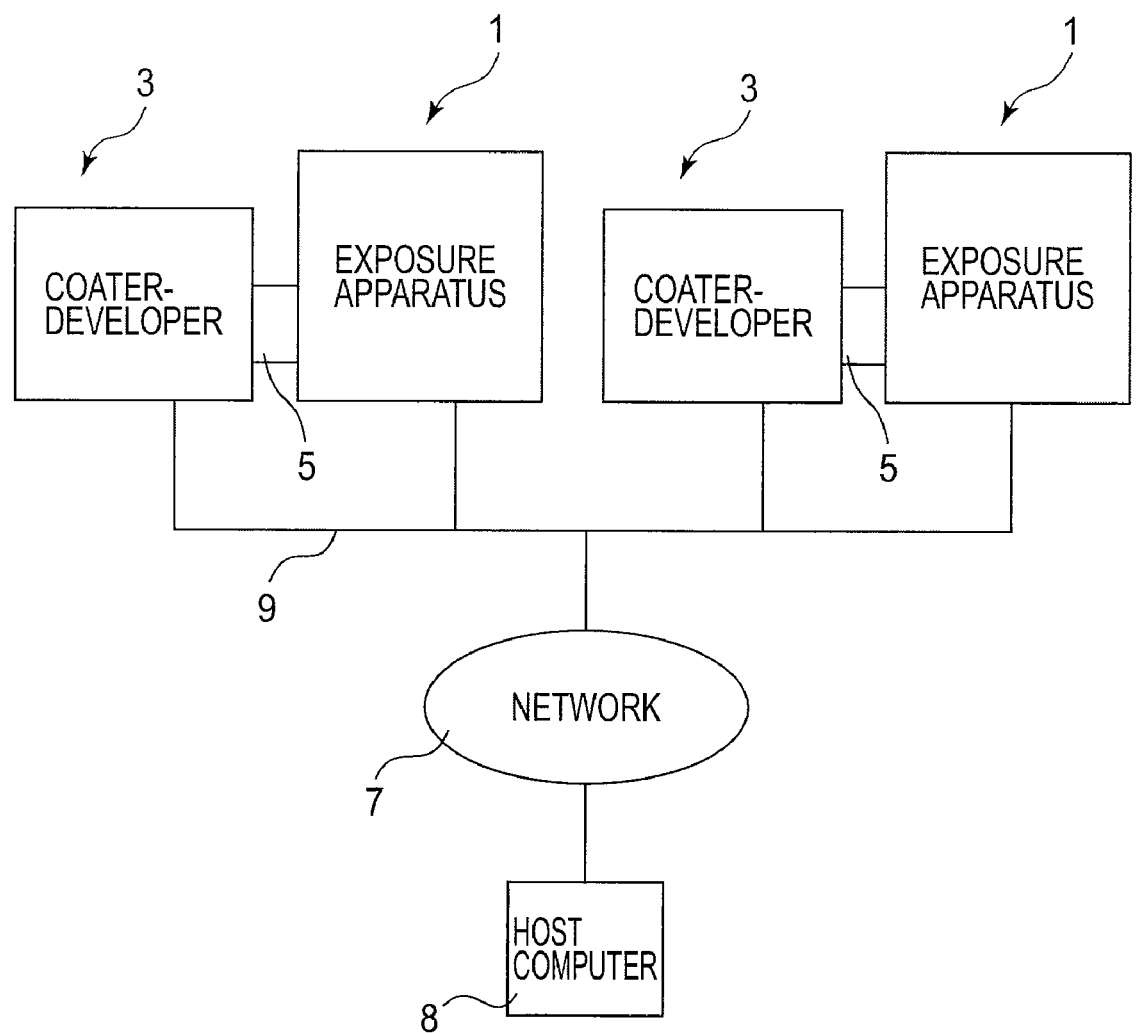
FIG. 3 is a diagrammatic view for explaining the structure of a network.

In the example described above, data communication is carried out directly between the network interfaces of the computers 2 and 4. However, as shown in FIG. 3, data communication may be made through a host computer 8. More specifically, the exposure apparatus 1 and the coater developer 3 may be connected by way of a network cable 9 to a network 7 or the like to which the host computer 8 is connected. In that occasion, direct data communication is not carried out between the exposure apparatus 1 and the coater developer 3, but rather it is made through the host computer 8. The host computer 8 may be provided inside the factory where the exposure apparatus 1 is installed or, alternatively, outside the factory. In place of using the network cable 9, a wireless LAN or the like may be used to enable wireless data communication between the exposure apparatus 1 and the coater developer 3.

Figure 4:
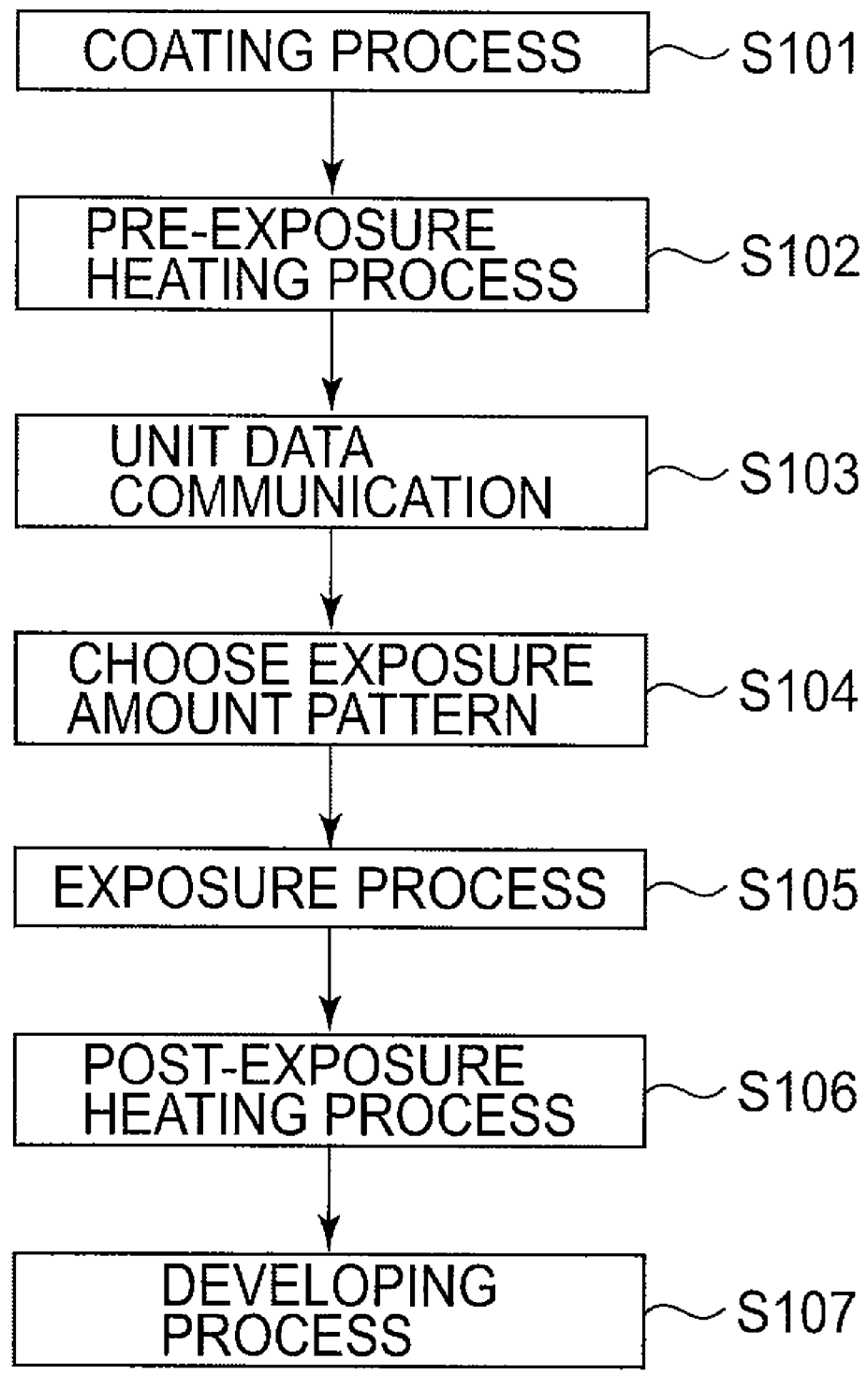
FIG. 4 is a flow chart for explaining the procedure of lithographic process.

Next, referring to FIG. 4, the lithographic process using these apparatuses will be described.

Wafers are conveyed to the coater developer 3 through an automatic conveying machine, not shown. One of the plural resist coating units 10 and 11 is chosen, and a resist coating process is carried out by this to each of the wafers conveyed thereto (S101). After this, a heating process is carried out to the wafer having been coated with the resist (S102). After the heat treatment, the wafer is conveyed into the exposure apparatus 1. The exposure apparatus 1 receives the wafer being coated with the resist, and makes communication of coating unit data or developing unit data (S103), to be described later. On the basis of these unit data, the exposure amount pattern that represents the exposure amounts corresponding to plural shots on the wafer, respectively, is chosen (S104). Subsequently, an exposure process is carried out to expose the resist on the wafer in accordance with the selected exposure pattern (S105). In this exposure process, an image of the pattern of the mask is projected onto the wafer resist, and a corresponding latent is formed thereon. The exposed wafer is then conveyed to the coater developer, whereby it is heated again (S106). Then, one of the resist developing units 12 and 13 is chosen and, by applying a developing liquid, a developing process is carried out so as to develop the latent image formed on the resist (S107). After that, an etching process, an ion injection process, and the like are carried out, whereby a circuit pattern is formed on the wafer.

As described hereinbefore, during the resist coating process, resist-film-thickness dispersion which is peculiar to each resist coating unit would be produced. For example, if a resist liquid or a developing liquid is applied to the wafer in accordance with a spin coating method, due to any differences of the spinner (rotational axis) and the pad, uneven coating will be produced along the radial direction. In combination with the wafer shape, the orientation flat and the orientation notch, this would result in differences in resist film thickness between the wafer central portion and the wafer peripheral portion.

In this embodiment, plural wafers are resist-coating processed by means of the resist coating unit 10 and the resist coating unit 11. Therefore, dispersion of resist film thickness would be different between the wafers processed by the resist coating unit 10 and the wafers processed by the resist coating unit 11.

In consideration of this, the exposure amount should desirably be adjusted in the exposure apparatus 1 in accordance with the dispersion of the film thickness of the resist applied to the wafer 41, namely, in accordance with the resist coating unit used to coat the wafer 41 with a resist.

Figure 5:
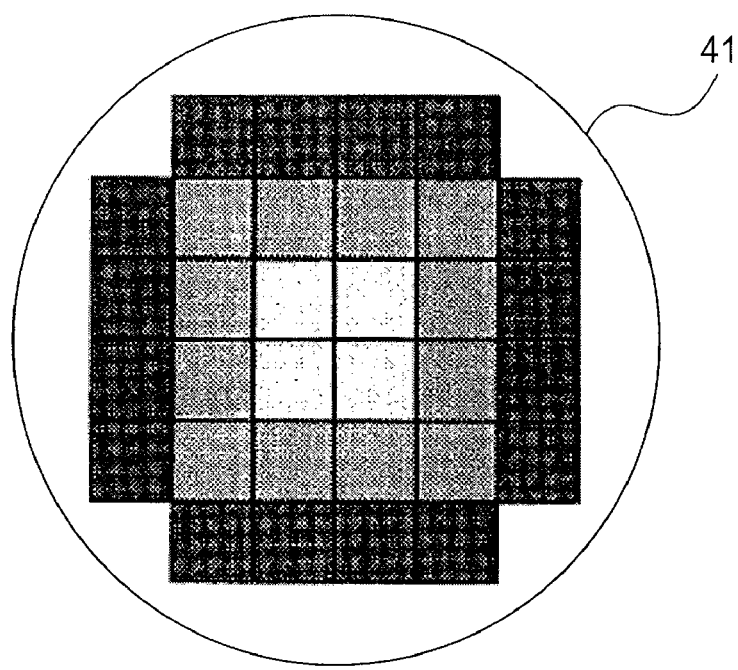
FIG. 5 is a schematic view, showing an example of exposure amount pattern setting for shot regions of a substrate.

For this exposure amount adjustment, in order to avoid a delay of exposure process, exposure amount patterns suitable to the resist coating units, respectively, should be set beforehand. First, by using the resist coating unit 10, a resist is applied to a wafer. During the coating, dispersion would be produced in the resist film thickness which dispersion is very peculiar to the resist coating unit 10. In consideration of this, exposure amounts appropriate to the resist film thicknesses are set. In the exposure amount setting, exposure amounts corresponding to shot regions, respectively, may be set. Alternatively, at an arbitrary position an exposure amount may be set as a function of the position on the flat wafer surface. If the exposure amount is set with respect to each shot region, as shown in FIG. 5, with respect to each of the shot regions of the wafer 41 (square regions shown in FIG. 5) as displayed on the display device of the exposure apparatus 1, numerical data corresponding to an exposure amount is inputted by using the input device such as a keyboard. In FIG. 5, the exposure amount is illustrated as the tone or shade, wherein darker tone depicts larger exposure amount. The exposure amount can be distinguished easily. With respect to all of these shot regions, exposure amounts are set. The thus set exposure amounts are memorized into the memory 32 as an exposure amount pattern. Also, such exposure pattern and the resist coating unit 10 are interrelated with each other. Similar exposure amount setting is carried out in relation to the resist coating unit 11, and a corresponding exposure amount pattern is memorized.

Figure 6:
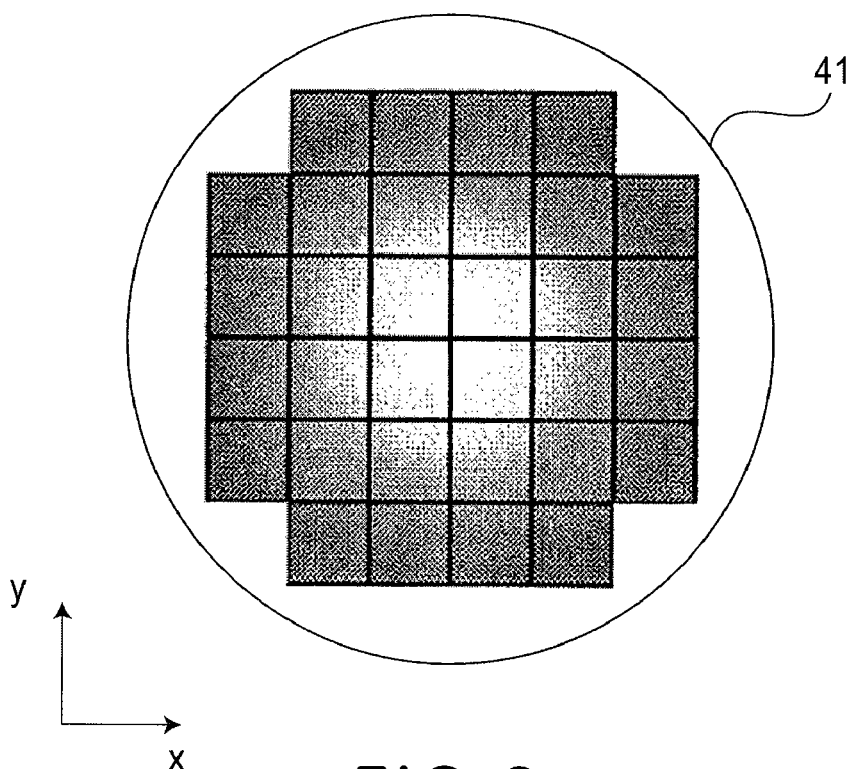
FIG. 6 is a schematic view, showing an example of Gaussian-distribution exposure amount pattern setting.

If the exposure amount is set as a function of the position on the flat surface of the wafer 31, as shown in FIG. 6, for example, the exposure amount can be expressed in terms of a negative Gaussian distribution, using variables x and y of an orthogonal coordinate system on the flat surface of the wafer 41 (along the sheet of the drawing). In this case, the average or standard deviation of Gaussian distribution, or correlation function may be set appropriately in accordance with the dispersion of the resist film thickness. Alternatively, the exposure amount distribution can be expressed by using a variable corresponding to the distance from a certain single point, for example, the distance from the center. The exposure amount distribution expressed in these ways can be memorized as an exposure pattern over the whole resist region.

There is a possibility that, if the exposure apparatus 1 and the resist coating units 10 and 11 are used for a long period of time, dispersion of the resist film thickness varies or an actual exposure amount deviates from the set exposure amount. In consideration of this, during sequential processes of lithography, the resist film thickness may be measured or the illuminance distribution on the wafer may be measured, and a correction value for the exposure amount may be calculated on the basis of the measurement results to change the preset exposure amount pattern appropriately.

As described above, the resist coating units are used to apply a resist onto wafers, and exposure amount patterns suitable to these coating units, respectively, are determined. Then, exposure amount patterns are stored into the memory 32, while being interrelated to the respective resist coating units.

Figures 7, 8, 9:
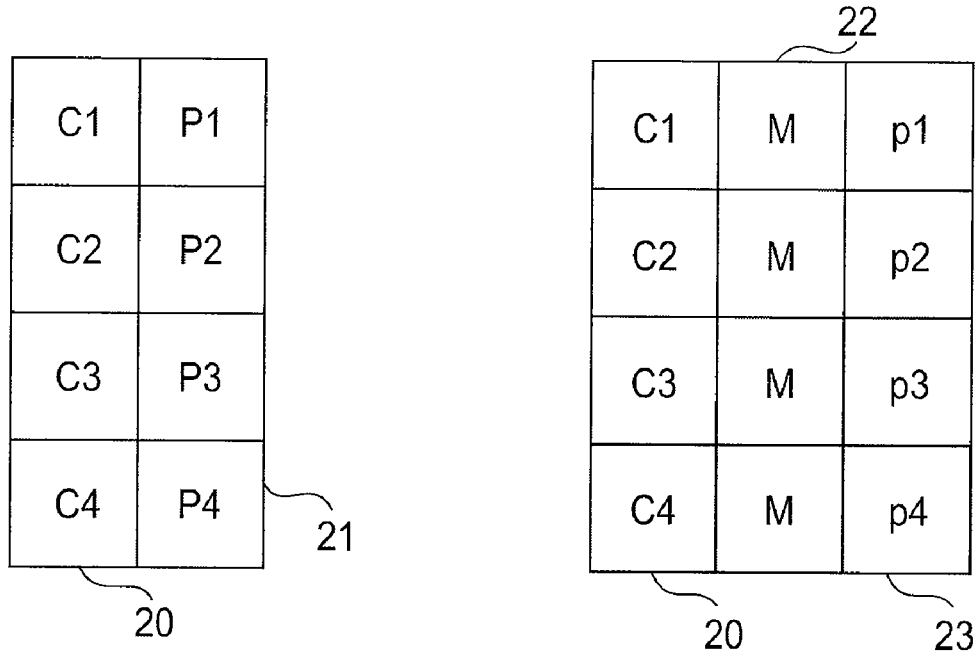
FIG. 7 is a diagrammatic view of exposure pattern choosing chart, in accordance with the first embodiment of the present invention.
FIG. 8 is a diagrammatic view of exposure pattern choosing chart, in accordance with a second embodiment of the present invention.
FIG. 9 is a diagrammatic view of exposure pattern choosing chart, in accordance with a third embodiment of the present invention.

Next, exposure amount pattern selection and data communication will be explained. FIG. 7 shows exposure amount pattern selection chart in this embodiment. At step S105 of FIG. 4, the exposure apparatus 1 carries out exposure of the resist on the wafer in accordance with the selected exposure amount pattern. Hence, before the exposure process, the exposure apparatus 1 obtains wafer information for distinction of the wafer 41 which is just going to be exposed. The wafer information may be an ID (identification) marked on the wafer, or it may be an ID agreed between the exposure apparatus 1 and the coater developer 3. As a further alternative, an ID used only inside the exposure apparatus when the same receives a wafer, may be prepared.

In addition to obtaining the wafer information, the exposure apparatus 1 further obtains coating unit data 20 (C1-C4) that represents which unit of the plural resist coating units should be used to apply a resist onto the substrate. Namely, the exposure apparatus 1 receives data (one of C1-C4) corresponding to the unit that has applied a resist to the wafer 41 designated by the wafer information, the data being supplied from the coater developer 3 through the network interface 35. In this example, four resist coating units are provided. The coating unit data 20 represents which unit of the four resist coating units should be used to apply a resist to a single substrate just going to be processed. The coating unit data 20 received by the exposure apparatus 1 is stored into the memory 32. By means of the control 31, one exposure amount pattern 21 corresponding to the coating unit data 20 is chosen, out of the exposure amount patterns 21 (P1-P4) similarly stored in the memory 32. Then, the exposure apparatus 1 carries out the exposure of the resist on the wafer 41 in accordance with the exposure pattern 21 selected.

For example, if the coating unit data 20 received by the exposure apparatus 1 is C2, an exposure amount pattern P2 corresponding to C2 is chosen out of the exposure amount patterns 21, and it is used as a target value of exposure amount for the exposure process.

As regards the communication timing of coating unit data 20, it may be during the wafer conveyance or, if prescheduled, it may be before the coating process. The data communication can be made at an arbitrary timing until the wafer to be processed is exposed. If communication is done after the coating process, the coating unit data 20 represents which unit of the plural resist coating units has applied a resist to the wafer.

If the order of using resist coating units is prescheduled, communication of coating unit data may be omitted. For example, in accordance with the coating unit data items organized in this order and stored in the memory 32, the exposure patterns may be scheduled in accordance with this order.

After the exposure process, the wafer information as well as the coating unit data 20 may be transferred to the coater developer 3. In such case, in the coater developer 3, an optimum resist developing unit may be chosen out of the resist developing units 12 and 13, in view of the processing at the resist coating unit.

This embodiment has been explained with reference to an example wherein the coater developer 3 has a plurality of resist coating units and a plurality of resist developing units, and wherein coating unit data communication is carried out between the coater developer 3 and the exposure apparatus 1. Here, the resist coating units and the resist developing units may be housed in separate machines. In such case, communication of coating unit data or wafer information may be carried out between the exposure apparatus and a resist coating machine having resist coating units. Furthermore, data communication may be made between the exposure apparatus and a resist developing machine having resist developing units. Here, the term "resist coating machine" is used to refer to an apparatus having a resist coating unit but not having a resist developing unit. Further, the term "resist developing machine" is used to refer to an apparatus having a resist developing unit but not having a resist coating unit.

Furthermore, although this embodiment has been explained with reference to an example wherein the lithographic process is carried out only once, the lithographic process may be carried out plural times such that a circuit pattern is formed on a wafer through plural exposures.

In this embodiment, in accordance with the coating unit data, an appropriate exposure amount pattern can be chosen without a delay of exposure process. Furthermore, since the exposure process is carried out with an appropriate exposure amount, a desired pattern can be produced on the wafer very precisely.

Embodiment 2

Referring now to FIG. 8, a second embodiment of the present invention will be explained. This embodiment differs from the first embodiment only in the point of selection of the exposure amount pattern. The structure and function of the remaining portion are similar to that of the first embodiment.

FIG. 8 illustrates an exposure amount pattern choosing chart according to this embodiment. In the exposure amount pattern choosing method of this embodiment, average exposure amount patterns 22 (M) are set with regard to the exposure amount patterns suitable to the resist coating units. Furthermore, differences 23 (p1-p4) between the exposure amount patterns corresponding to the resist coating units and the average exposure amount pattern 22 are registered.

In this method, if the coating unit data 20 is not obtainable, an average exposure amount pattern 22 (M) is used. If the coating unit data 20 is obtainable, differential information 23 is added to the average exposure amount pattern 22, and the sum is used.

In this embodiment, even if the coating unit data is unavailable, an average exposure amount pattern is used. Hence, an appropriate exposure amount can be chosen without a delay of exposure process. Furthermore, since the exposure process is carried out with a proper exposure amount, a desired circuit pattern can be produced on the wafer very precisely.

Embodiment 3

Referring now to FIG. 9, a third embodiment of the present invention will be explained. Similarly to the resist coating units, the resist developing units have errors peculiar to the units. Thus, the pattern to be formed on the wafer may be influenced by the resist developing unit to be used for the developing process. In this embodiment, when the exposure amount is corrected, a resist developing unit to be used in the subsequent process is specified. Then, the exposure apparatus 1 is operationally associated with both of the resist coating unit and the resist developing unit.

The disposition of various components and the data communication method, up to reception of the coating unit data of the coater developer 3, are similar to those of the first embodiment.

FIG. 9 illustrates the exposure amount pattern choosing chart. The exposure apparatus 1 obtains wafer information and receives coating unit data 20 (C1-C4) concerning the unit that has applied a resist to the wafer specified by the wafer information. After this, in accordance with the developing unit data 24 (D1-D4) that represents which unit of the plural resist developing units should be used to develop the resist on the substrate, the data (one of D1-D4) for the developing unit to be used in the subsequent process is chosen. In this example, four resist developing units are provided. Then, an exposure amount pattern (one of P1-P6) corresponding to the combination of the coating unit data and the developing unit data is chosen.

For example, if the coating unit data for the unit by which the wafer is coated with a resist, as received by the exposure apparatus 1, is C3, and the developing unit data for the wafer developing process to be made subsequently is assumed as D2. Then, an exposure amount pattern of P10 corresponding to the combination of C3 and D2 is chosen, and this exposure amount pattern is used as a desired value for the exposure amount for the exposure process.

The manner of unit data handling, data communication timing and exposure amount correction pattern setting are similar to those of the first embodiment.

In this embodiment, the exposure apparatus obtains resist coating unit data as well as data for the resist developing unit to be used in the subsequent process.

The resist coating units and the resist developing units may be housed in a single machine or, alternatively, they may be disposed in separate machines.

In accordance with this embodiment of the present invention, an appropriate exposure amount can be chosen while taking into account the developing process, without a delay of exposure process. Hence, a desired circuit pattern can be produced on the wafer at high precision.

Embodiment 4

Next, referring to FIGS. 10 and 11, an embodiment of a device manufacturing method which is based on an exposure method described with reference to the first to third embodiments, will be explained.

Figure 10:
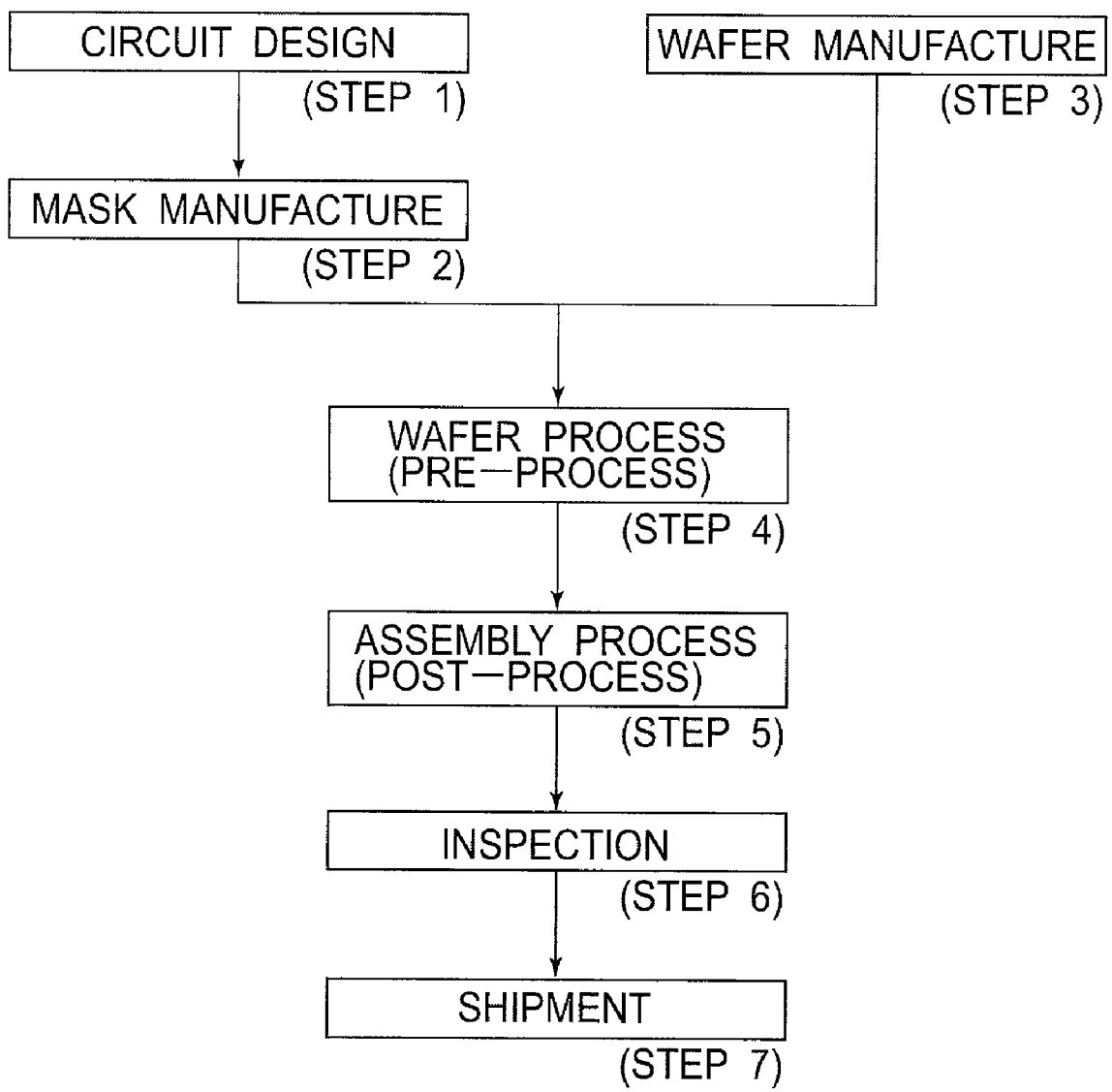
FIG. 10 is a flow chart for explaining semiconductor device manufacturing processes.

FIG. 10 is a flow chart for explaining the procedure of manufacturing various microdevices such as semiconductor chips (e.g., ICs or LSIs), liquid crystal panels or CCDs, for example. Here, manufacture of semiconductor chips will be described as an example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 11:
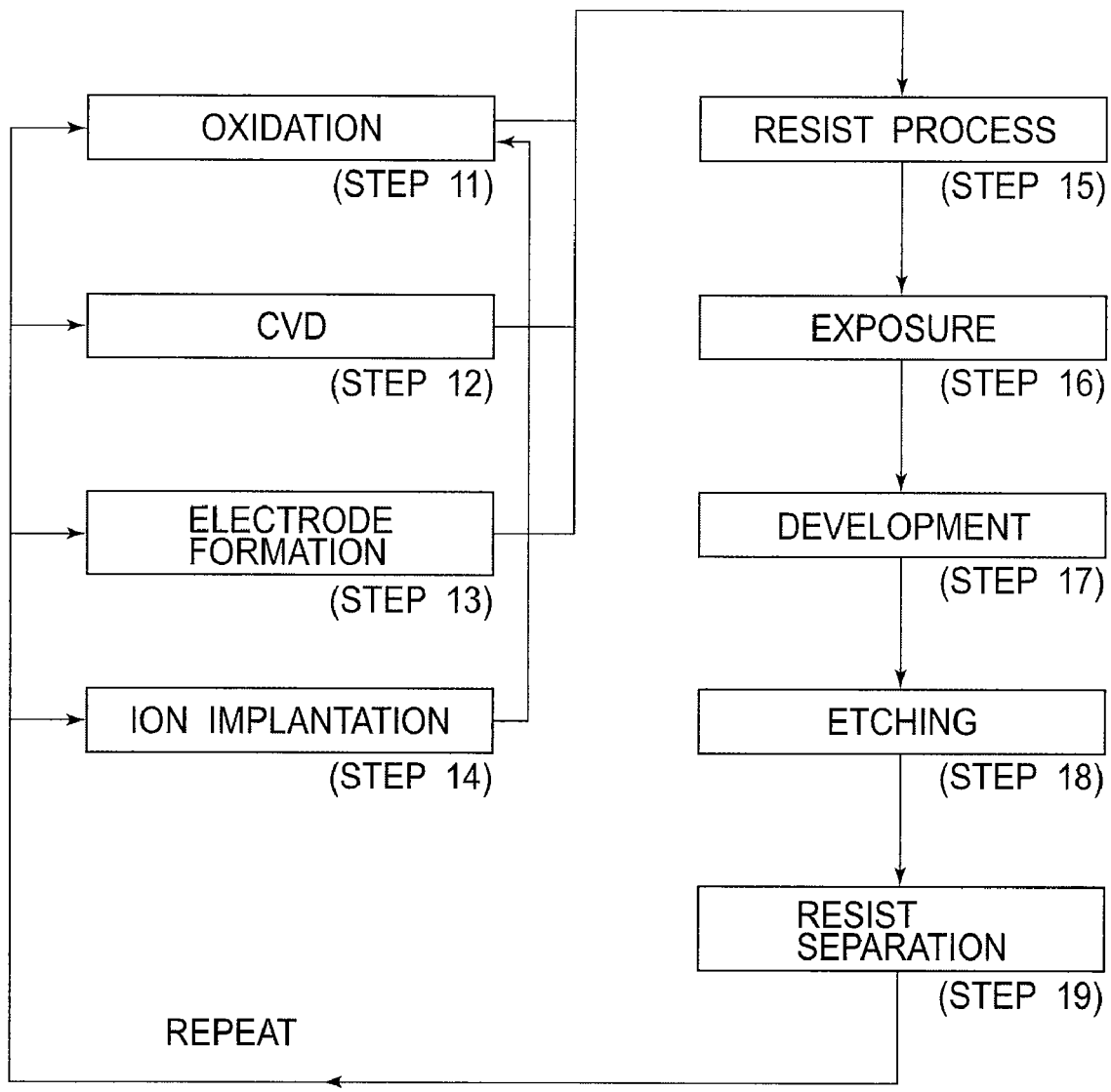
FIG. 11 is a flow chart for explaining details of the wafer process.

FIG. 11 is a flow chart for explaining details of the wafer process at Step 4 in FIG. 10.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2005-354019 filed Dec. 7, 2005,and No. 2006-273904 filed Oct. 5, 2006,for which is hereby incorporated by reference.

What is claimed is:

1. An exposure method for exposing a resist to be applied onto a substrate by one of a plurality of resist coating units, said method comprising:
   a data transmission step for transmitting data of the resist coating unit between an apparatus that includes the plurality of resist coating units and an exposure apparatus for exposing the resist applied to the substrate, data of the resist coating unit specifying which unit among the plurality of resist coating units should be used to apply a resist onto the substrate;
   a selecting step for choosing an exposure amount pattern that represents exposure amounts corresponding to a plurality of shots on the substrate, respectively, on the basis of data of the resist coating unit;
   an exposure step for exposing the resist applied onto the substrate, in accordance with the exposure amount pattern chosen by said selecting step;
   a data receiving step of receiving the data of the resist coating unit by an apparatus including a plurality of resist developing units; and
   a developing step of selecting one of resist developing unit from the plurality of resist developing units on the basis of the data of the resist coating unit, and developing the resist on the substrate exposed using the selected resist developing unit.

2. A method according to claim 1, wherein the data of the resist coating unit is transmitted after one of the plurality of resist coating units applies a resist onto the substrate, and wherein the data of the resist coating unit represents which unit of the plurality of resist coating units has applied a resist to the substrate.

3. An exposure method for exposing a resist to be applied onto a substrate by one of a plurality of resist coating units and to be developed by one of a plurality of resist developing units, said method comprising:
   a data transmission step for transmitting the data of the resist coating unit between an apparatus that includes the plurality of resist coating units and an exposure apparatus for exposing the resist applied to the substrate and for transmitting data of the resist developing unit between an apparatus that includes the plurality of resist developing units and the exposure apparatus, wherein the data of the resist coating unit specifies which unit among the plurality of resist coating units should be used to apply a resist onto the substrate, and the data of the resist developing unit specifies which unit among the plurality of resist developing units should be used to develop the resist on the substrate;
   a selecting step for choosing an exposure amount pattern that represents exposure amounts corresponding to a plurality of shots on the substrate, respectively, on the basis of data of the resist coating unit and of data of the resist developing unit; and
   an exposure step for exposing the resist applied onto the substrate, in accordance with the exposure amount pattern chosen by said selecting step.

4. A method according to claim 3, further comprising a data transmission step in which the resist coating unit data and the resist developing unit data are transmitted between a resist coating and developing apparatus that includes the plurality of resist coating units and the plurality of resist developing units, and an exposure apparatus for exposing the resist applied to the substrate.

* * * * *